United States Patent [19]
Guan

[11] 4,357,162
[45] Nov. 2, 1982

[54] SOLDER COMPOSITION
[75] Inventor: Der-Yang Guan, Poughkeepsie, N.Y.
[73] Assignee: Motorola, Inc., Schaumburg, Ill.
[21] Appl. No.: 214,402
[22] Filed: Dec. 8, 1980

Related U.S. Application Data
[63] Continuation of Ser. No. 81,702, Oct. 4, 1979, abandoned.
[51] Int. Cl.³ .................... C22C 14/00; C22C 13/00
[52] U.S. Cl. .................... 75/175 R; 75/175 A
[58] Field of Search .................... 75/175 R, 175 A

[56] References Cited
U.S. PATENT DOCUMENTS
2,124,589  7/1938  Palm et al. .................... 75/175

FOREIGN PATENT DOCUMENTS
52-6468  1/1977  Japan .

Primary Examiner—Upendra Roy
Attorney, Agent, or Firm—John A. Fisher

[57] ABSTRACT

A solder composition for bonding a semiconductor die to a plated or unplated metal package member. In one embodiment the solder composition comprises, in weight percent, 5–8 copper, 20–40 silver, and the balance tin. Such a composition is particularly efficacious for bonding to copper and copper alloy package members. A further embodiment particularly efficacious for bonding to nickel and nickel alloy members further comprises the addition of 0.5–3.0 weight percent selenium.

7 Claims, 1 Drawing Figure

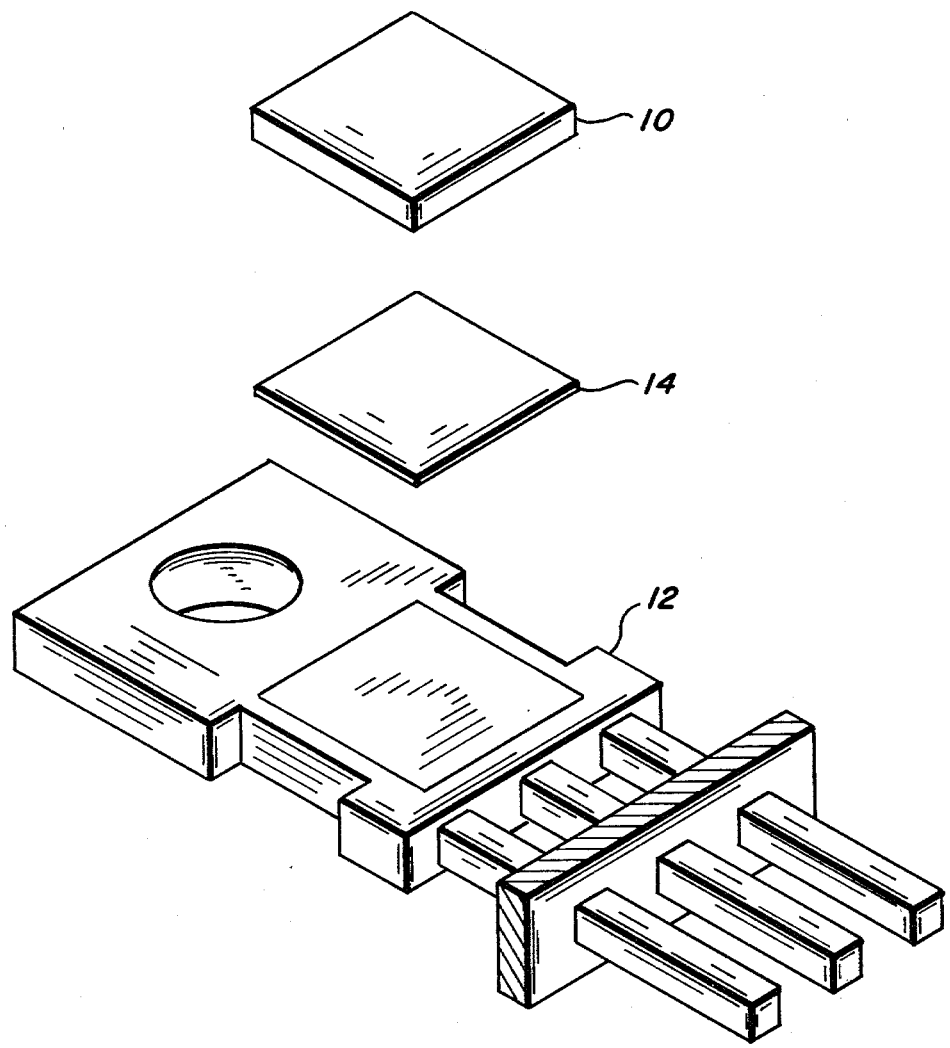

SOLDER COMPOSITION

This is a continuation of application Ser. No. 081,701, filed Oct. 4, 1979 now abandoned.

BACKGROUND OF THE INVENTION

This invention relates to a solder composition and more particularly to solder compositions suitable for bonding a semiconductor die to plated and unplated metal package members.

In the fabrication of semiconductor devices including transistors, diodes, integrated circuits, and the like it is conventional to fabricate a semiconductor die and then to attach that die to a metal package member or header. The metal package member ultimately serves for mounting support, protection, electrical connection, and dissipation of heat generated in the operation of the device. The attachment is accomplished by using an epoxy resin or a metal alloy solder. Epoxy resin is generally unsatisfactory in most applications because of its inherently high electrical resistance and low thermal conductivity. The metal and metal alloy solders used for die attachment are conventionally divided into hard solders and soft solders. The hard solders, typically gold alloys, form strong bonds which have excellent thermal and electrical properties; but the high strength of the hard solder can cause the semiconductor die to fracture or the die and metal member to deform elastically under thermal stress because the hard solder transfers the stress to the die without plastic deformation in the die bond. The conventional soft solders, typically lead or tin alloys, are plastic enough to accommodate the thermal expansion mismatch between the die and the package, but are susceptible to metal fatigue after repeated temperature cycles. Such metal fatigue can result in device reliability problems. Thicker layers of the soft solder can reduce the stress in the solder and lessen the fatigue problem but only at the expense of undesirably higher thermal resistance. Intermediate solders such as the silver-tin-antimony alloys disclosed in application Ser. No. 788,954 assigned to the assignee of the present application and filed Apr. 19, 1977 now U.S. Pat. No. 4,170,472, have characteristics intermediate between the hard and soft solders and are able to overcome many of the problems attendant with the prior art solders. But all of these solders, hard, soft, or intermediate, require special surfaces to which to bond. This usually entails, for example, the plating of the package member with a layer or layers of gold, silver, nickel, or the like. Similarly, the back of the die itself is covered, usually by evaporation, with a layer of a suitable metal such as gold or silver. These special metals on the package and on the die are required because the solders employed either will not wet or will not adequately wet, the conventional package materials under standard bonding conditions. This requirement of specially plated packages greatly adds to the expense of the package both because of additional processing steps required and because of the expense of the plating metal itself.

Accordingly, a need existed to provide solder alloy compositions which would overcome the problems of prior art compositions to produce a high yielding, low cost composition and method for the attachment of semiconductor die to metal package members.

It is therefore an object of this invention to provide an improved solder alloy composition for the attachment of semiconductor die to plated or unplated metal package members.

It is a still further object of this invention to provide a solder composition for semiconductor die attachment having desirable electrical, thermal, and thermal fatigue resistant properties.

SUMMARY OF THE INVENTION

In one embodiment of the invention, a solder alloy composition is provided which comprises, in weight percent 5–8 copper, 20–40 silver, and the balance tin. This solder composition is particularly suited to the bonding of semiconductor die directly to copper based metal package members. In another embodiment of the invention the solder alloy composition further comprises about 0.5–3.0 weight percent selenium to render the composition particularly effective in bonding semiconductor die to nickel based metal package members. By using either composition the semiconductor die can be attached to the plated or unplated metal package member by applying the composition to either the package member or to the back of the die and by heating to a temperature of approximately 400°–500° C. to cause the solder composition to flow.

BRIEF DESCRIPTION OF THE DRAWING

The sole FIGURE shows in exploded view a representative package member, a die, and the solder which is to bond the two into a unitary assembly.

DETAILED DESCRIPTION OF PREFERRED EMBODIMENTS

The sole FIGURE shows a semiconductor die 10 which is to be attached to a metal package member or lead frame 12. Die 10 is to be attached using a solder alloy composition shown here as a solder preform 14. The die can be, for example, a silicon power transistor or other semiconductor device. Lead frame 12 is typically formed of copper, a copper alloy, or a nickel alloy. The lead frame shown is representative of a wide variety of lead frames of the TO-220 type. The die is attached to the lead frame, leads are bonded to the device electrodes, and the device and portion of the lead frame are encapsulated in plastic. The form of the package is not important to the invention and can be the plastic package as described, a metal can package such as the TO-3, a metalized glass frit or ceramic, or the like. The lead frame can be plated or unplated, but by using a solder composition in accordance with the invention, plating is not necessary.

In accordance with the invention a solder alloy composition has been developed which provides an intermediate solder (that is, one having properties intermediate between the known hard and soft solders) which can be used for attaching die to either plated or unplated metal package members. The solder is based on copper, silver, tin ternary alloys with the possible addition of selenium to further enhance the wetting on nickel based package parts.

The solder alloy composition is tin based to provide a low temperature alloy. By low temperature alloy is meant an alloy having a melting point between about 200° C. and 500° C., a temperature range compatible with semiconductor devices. Silver is added to the tin to provide an alloy which has improved wetting. Especially on copper, the wetting was found to increase slowly with silver content up to about 20 weight percent and then to rise rapidly between 20 to 40 weight percent. The addition of silver also alters the kinetics of wetting. Pure tin tends to ball up upon melting and the addition of silver reduces this tendency. The length of the spreading period also increases with the silver content. When the silver content is smaller than 20 weight percent the solder spreads out with a series of surges before saturating. When the silver content is between 20 and 40 weight percent, continuous spreading is observed up to saturation.

To the tin-silver binary alloy is added about 5-8 weight percent of copper to improve the mechanical strength of the alloy. The alloy properties are optimized when the ratio of silver to copper is in the range of about 3.9-4.4 to 1 and especially when the ratio is about 4.3 to 1.

To further improve the wetting characteristics of the solder alloy, especially on nickel based package parts, a small amount, about 0.5 to 3.0 weight percent, of selenium is added to the alloy. The additional selenium has little effect when bonding a semiconductor die to a copper based package, but has an appreciable desirable effect when bonding to a nickel based substrate.

One method for evaluating the wetting behavior of the various solder alloys is to observe the behavior of the solder when melted on a substrate under simulated bonding conditions. The various solders were formed into preforms and melted on the various substrate materials under controlled ambient conditions. To evaluate the wetting the normalized areal spread (NAS) was determined. The normalized areal spread is determined by first measuring the spread of the preform after melting and then normalizing this with the maximum cross sectional area of a sphere which possesses the same volume as the solder. The greater the wetting ability of the solder alloy, the greater will be the NAS.

The following table compares the wetting behavior as measured by NAS for solder alloy compositions in accordance with the invention to various well known hard and soft solders. The various alloys have been identified by a letter designation. The alloys B, C, B1, and C1 are illustrative of the invention, but the invention is not to be construed as limited to these examples. Alloys S, T, and U are hard solders and V and W are well known soft solders. The wetting behavior is shown on substrates of copper, alloy 194 and alloy 155 which are copper based alloys, and on nickel, Kovar and alloy 42 which are nickel based alloys.

| Alloy Designation | Composition (wt. %) | N.A.S. | | | | | |
|---|---|---|---|---|---|---|---|
| | | Alloy 194 | Alloy 155 | OFHC | Ni | Kovar | Alloy 42 |
| S | Au-12 Ge | 8 | 8 | 0 | | 0 | 0 |
| T | Au-20 Sn | 7 | 3 | 5 | 2 | 0 | 0 |
| U | Au-3 Si | 0 | 0 | 0 | 0 | 0 | 0 |
| V | Pb-5 Sn | 2 | 2 | 2 | 4 | 2 | 2 |
| W | Pb-5 In-2.5 Ag | 0 | 0 | 0 | 4 | 0 | 0 |
| B | Sn-26 Ag-6.8Cu | 18 | 20 | 20 | 3 | 2 | 3 |
| C | Sn-35 Ag-8Cu | 30 | 25 | 22 | 4 | 2 | 4 |
| B1 | Sn-25.5 Ag-6.8Cu-0.5Se | 13 | 13 | 12 | 5 | 2 | 6 |
| C1 | Sn-34.5 Ag-8Cu-0.5Se | 12 | 13 | 12 | 7 | 5 | 7 |

In almost every instance the alloys in accordance with the invention are far superior to either the hard or soft solder alloys. Alloys B and C without any selenium are best on copper and copper based substrates, while B1 and C1 each containing 0.5 weight percent selenium are superior on the nickel and nickel based substrates.

Although the amount of selenium added to the alloy composition seems to be a small amount, it is important, especially on the nickel based substrates. The selenium has little effect on the wetting of copper based substrates if the amount of selenium is kept small. The addition of 3 weight percent of selenium, for example, is found to reduce the NAS on copper based substrates by almost 50 percent. Including 0.5 weight percent of selenium in the alloy composition, however, retains 90 percent of the wetting ability. On nickel based substrates the effect of the selenium is much more evident. Adding about 0.5 weight percent of selenium to alloy C to form alloy C1 increases the NAS on a Kovar substrate by up to 300 percent and on other nickel based substrates by up to 100 percent. The addition of more than 3 weight percent of selenium, however, causes a decrease in the wetting ability even on the nickel based substrates. From the standpoint of wetting ability, the best composition is found to contain between 0.5 and 1.5 weight percent of selenium.

In accordance with the invention the improved solder composition can be used for the attachment of a semiconductor die to a metal or metalized package member. Oxides, oils, grease, and other contamination are almost always present on the metal substrate surface. The oils grease and other contamination can be removed by cleaning in a detergent solution and by subsequent degreasing in alcohol or other organic solvent. The substrates are then dried and stored in clean, non-oxidizing ambient until needed. Further cleaning with acids to remove the oxide film can improve the wetting characteristics but is not essential with the solder alloys in accordance with this invention. Also, fluxes which are designed to clean the surface are not needed for proper wetting. Because of its corrosive property and incompatability with semiconductor die, fluxing is not recommended and is usually strictly avoided in the die bonding process.

The ambient atmosphere in which the die attachment takes place is very important to the spreading of the molten solder. NAS values for the free wetting of solder are reduced when the oxygen concentration in the ambient is more than about 100 parts per million (ppm). The die attachment can, however, be accomplished, especially when pressure assigned, when the oxygen concentration in the ambient is more than about 10,000 ppm if the bonding time is kept short enough. Preferably the oxygen concentration is kept as low as conveniently possible in a flowing and otherwise inert ambient. The bonding can be readily accomplished within an enclosure containing an atmosphere containing about 5 percent hydrogen in nitrogen. The oxygen content of this atmosphere is monitored and kept at the desired low level. High levels of oxygen in the atmosphere or long bonding times have the deleterious effect of causing an oxide film to form on the molten solder before the bonding process can be completed.

For compatability with semiconductor devices, an acceptable temperature range for die bonding is between about 200° and 500° C. For optimum bonding which includes a strong die attach and a minimum time-temperature exposure of the semiconductor die, the die bond temperature is preferably maintained between 400° and 500° C. For alloy compositions in accordance with this invention a die bonding temperature of about 425° C. is particularly suitable.

The solder can be supplied to the bonding process in a number of different forms. If the solder is, for example, in a ribbon or wire form, a small portion of that ribbon or wire can be melted on the metal substrate member under conditions as described above to provide a presoldered area to which the die can be attached in a subsequent heating step. Alternatively, the solder alloy composition can be provided in a preform having a thickness of about 0.10 to 0.25 mm and having a circular or rectangular area of sufficient size to supply the needed solder for the particular size die being bonded. The preform can be used in the same manner as the ribbon or wire to form a presoldered area on the metal package member or the package, preform, and die can be stacked together and the die attached in a single heating step. In the latter heating step pressure may have to be applied to the die to ensure proper seating as the preform melts. In a preferred process the solder alloy composition is applied to the back of the semiconductor die. This can be done, for example, by a deposition process such as evaporation or sputtering which deposits the composition onto the back of the semiconductor wafer before that wafer is separated into individual die. In such a process a brittle alloy is desirable for back metallization. The brittleness is desired because in separating the wafer into individual die by a scribe and break procedure, solders which are not brittle can form hinges holding the die together and ultimately leading to die breakage, die scatter, metal removal, or other yield loss as the die are forceably separated. In this respect alloy C is the most brittle, and thus the most desirable. The hard and soft solders are all generally less brittle. If the solder alloy composition is applied to the back of the die in this manner, the die can be attached to a metal package member without providing additional solder as a preform or other form. This process, therefore, reduces assembly time and complexity.

It is thus apparent that there has been provided, in accordance with the invention, an improved solder alloy composition which allows the bonding of a semiconductor die to either a plated or unplated metal or metallized package member. While the invention has been described in conjunction with the attachment of semiconductor die to package members formed of particular alloys, it is not intended that the invention nor its usage be so limited. The solder composition can also be used for the attachment of die to other copper and nickel based substrates, or to package members having a copper or nickel based coating. Other variations and modifications will, of course, be apparent to those skilled in the art in the light of the foregoing description. Accordingly, it is intended to embrace all such variations and modifications as fall within the scope of the appended claims.

I claim:

1. A solder composition for bonding a semiconductor die to a plated or unplated metal package member comprising, in weight percent, about 5–8 copper, 20–40 silver, 0.5–3.0 selenium, and balance tin.

2. The solder composition of claim 1 comprising about 0.5 to 1.5 weight percent selenium.

3. The composition of claim 1 wherein said silver and said copper are present in a ratio of about 3.9:1 to 4.4:1.

4. The composition of claim 1 comprising in weight percent about 6.8 to 8.0 copper, 25.5 to 34.5 silver, 0.5 to 3.0 selenium, and balance tin.

5. The solder composition of claim 2 comprising, in weight percent, about 6.8 copper, 25.5 silver, 0.5 selenium and balance tin.

6. The solder composition of claim 2 comprising, in weight percent, about 8.0 copper, 34.5 silver, 0.5 selenium and balance tin.

7. The composition of claim 3 wherein said silver and said copper are present in a ratio of about 4.3:1.

* * * * *